US010062869B2

(12) United States Patent
Tokuda (10) Patent No.: US 10,062,869 B2
(45) Date of Patent: Aug. 28, 2018

(54) DISPLAY DEVICE HAVING STACKED RESIN LAYERS

(71) Applicant: Japan Display Inc., Minato-ku (JP)

(72) Inventor: Naoki Tokuda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/366,475

(22) Filed: Dec. 1, 2016

(65) Prior Publication Data

US 2017/0250374 A1 Aug. 31, 2017

(30) Foreign Application Priority Data

Feb. 25, 2016 (JP) .................................. 2016-034470

(51) Int. Cl.
*H01L 51/52* (2006.01)
*H01L 51/50* (2006.01)
*H01L 27/32* (2006.01)

(52) U.S. Cl.
CPC ........ *H01L 51/5275* (2013.01); *H01L 27/323* (2013.01); *H01L 27/3244* (2013.01); *H01L 51/5012* (2013.01); *H01L 51/5206* (2013.01); *H01L 51/5221* (2013.01); *H01L 51/5253* (2013.01); *H01L 51/5293* (2013.01); *H01L 2251/301* (2013.01); *H01L 2251/5338* (2013.01)

(58) Field of Classification Search
CPC ............ H01L 51/5275; H01L 51/5012; H01L 51/5206; H01L 51/5221; H01L 51/5253; H01L 51/5293; H01L 27/323; H01L 27/3244

See application file for complete search history.

(56) References Cited

U.S. PATENT DOCUMENTS

| | | | | |
|---|---|---|---|---|
| 6,583,440 B2 * | 6/2003 | Yasukawa | ......... | H01L 21/76254 257/347 |
| 7,230,271 B2 * | 6/2007 | Yamazaki | ........... | H01L 51/5253 257/59 |
| 8,916,858 B2 * | 12/2014 | Nakano | ............... | H01L 51/5253 257/40 |
| 8,956,895 B2 * | 2/2015 | Yamazaki | ............. | H01L 27/322 257/E21.002 |
| 9,000,443 B2 * | 4/2015 | Hatano | ............... | H01L 51/5243 257/72 |
| 9,412,334 B2 * | 8/2016 | Watakabe | ......... | G02F 1/133514 |

(Continued)

FOREIGN PATENT DOCUMENTS

| | | |
|---|---|---|
| JP | 2004-177785 | 6/2004 |
| JP | 2015-156275 | 8/2015 |

*Primary Examiner* — Ida M Soward
(74) *Attorney, Agent, or Firm* — Oblon, McClelland, Maier & Neustadt, L.L.P.

(57) ABSTRACT

A display device includes: a light-emitting element including a light-emitting layer, an anode, and a cathode, the anode and the cathode interposing the light-emitting layer therebetween; a sealing layer covering the light-emitting element, at least an uppermost layer of the sealing layer being composed of a silicon nitride film; a first resin layer stacked on and in contact with the silicon nitride film; and a second resin layer stacked on and in contact with the first resin layer. A difference between refractive indices of the silicon nitride film and the first resin layer is less than 0.3. A difference between refractive indices of the first resin layer and the second resin layer is less than 0.3.

19 Claims, 6 Drawing Sheets

(56) References Cited

U.S. PATENT DOCUMENTS

| | | | | |
|---|---|---|---|---|
| 9,564,474 B2* | 2/2017 | Sasaki | ............... | H01L 21/31111 |
| 9,799,772 B2* | 10/2017 | Sugawara | ......... | H01L 29/78606 |
| 2008/0073740 A1* | 3/2008 | Shibayama | ........ | H01L 27/14618 |
| | | | | 257/434 |
| 2009/0218943 A1* | 9/2009 | Nishimura | .......... | H01L 51/5275 |
| | | | | 313/512 |
| 2011/0108812 A1* | 5/2011 | Sumita | ................ | H01L 27/3248 |
| | | | | 257/40 |
| 2015/0221893 A1* | 8/2015 | Teraguchi | ........... | H01L 51/5271 |
| | | | | 257/40 |
| 2015/0287959 A1* | 10/2015 | Hanamura | .......... | H01L 51/5246 |
| | | | | 257/40 |
| 2016/0056224 A1* | 2/2016 | Hirakata | ................ | H01L 27/15 |
| | | | | 257/98 |
| 2016/0062168 A1* | 3/2016 | Fukushima | ......... | G02F 1/13363 |
| | | | | 438/158 |
| 2016/0104760 A1* | 4/2016 | Maeda | ............... | H01L 51/5228 |
| | | | | 257/40 |
| 2016/0190514 A1* | 6/2016 | Masuda | ............. | H01L 51/5259 |
| | | | | 257/40 |
| 2018/0088425 A1* | 3/2018 | Kimura | ............... | H01L 27/1218 |

* cited by examiner

DISPLAY DEVICE HAVING STACKED RESIN LAYERS

CROSS-REFERENCE TO RELATED APPLICATION

The present application claims priority from Japanese application JP2016-034470 filed on Feb. 25, 2016, the content of which is hereby incorporated by reference into this application.

BACKGROUND OF THE INVENTION

1. Field of the Invention

The present invention relates to a display device.

2. Description of the Related Art

A light-emitting element layer such as an organic electroluminescent layer deteriorates due to moisture absorption, and therefore, the light-emitting element layer is covered by a sealing film for shielding from the atmosphere. A polarizer is attached to the sealing film for preventing external light reflection. A touch screen, a cover glass, or the like is stacked on the polarizer.

SUMMARY OF THE INVENTION

Since a plurality of layers to be stacked have different refractive indices when formed of different materials, there is a problem in that efficiency of light extraction (transmittance or light use efficiency) is reduced due to interface reflection. Especially when the sealing film is formed of SiN having a large refractive index, the difference between refractive indices of the sealing film and an adhesive material provided thereon is large. JP 2004-177785 A and JP 2015-156275 A disclose the refractive indices of a polarizer and an adhesive material, but do not specify the refractive indices of a sealing film and an adhesive material located thereon.

It is an object of the invention to reduce reflection at an interface.

A display device according to an aspect of the invention includes: a light-emitting element including a light-emitting layer, an anode, and a cathode, the anode and the cathode interposing the light-emitting layer therebetween; a sealing layer covering the light-emitting element, at least an uppermost layer of the sealing layer being composed of a silicon nitride film; a first resin layer stacked on and in contact with the silicon nitride film; and a second resin layer stacked on and in contact with the first resin layer, wherein a difference between refractive indices of the silicon nitride film and the first resin layer is less than 0.3, and a difference between refractive indices of the first resin layer and the second resin layer is less than 0.3. According to the aspect of the invention, since the refractive indices are set as described above, reflection at the interface can be reduced.

A display device according to an aspect of the invention includes: a light-emitting element including a light-emitting layer, an anode, and a cathode, the anode and the cathode interposing the light-emitting layer therebetween; a sealing layer covering the light-emitting element, at least an uppermost layer of the sealing layer being composed of a silicon nitride film; a first resin layer stacked on and in contact with the silicon nitride film; and a second resin layer stacked on and in contact with the first resin layer, wherein a refractive index of the first resin layer is smaller than a refractive index of the silicon nitride film, and a refractive index of the second resin layer is smaller than the refractive index of the first resin layer. According to the aspect of the invention, since the refractive indices are set as described above, reflection at the interface can be reduced.

A display device according to an aspect of the invention includes: a light-emitting element including a light-emitting layer, an anode, and a cathode, the anode and the cathode interposing the light-emitting layer therebetween; a sealing layer covering the light-emitting element, at least an uppermost layer of the sealing layer being composed of a silicon nitride film; a resin layer stacked on and in contact with the silicon nitride film, the resin layer being made of a bonding material or an adhesive material; and an optical film stacked on an opposite side of the resin layer from the silicon nitride film, the optical film being in contact with the resin layer, wherein the silicon nitride film includes a first region in contact with the resin layer, and a second region which is closer to the light-emitting element than the first region is, the first region has a first refractive index, the second region has a second refractive index, and a difference between a refractive index of the resin layer and the first refractive index is smaller than a difference between the refractive index of the resin layer and the second refractive index. According to the aspect of the invention, since the refractive indices are set as described above, reflection at the interface can be reduced.

DETAILED DESCRIPTION OF THE INVENTION

Hereinafter, embodiments of the invention will be described with reference to the drawings. However, the invention can be implemented in various aspects within the scope not departing from the gist thereof, and should not be interpreted as being limited to the details described in the following exemplary embodiments.

In the drawings, the width, thickness, shape, and the like of each part may be schematically represented for more clarity of description, compared to those in practicing aspects of the invention. However, they are illustrative only, and do not limit the interpretation of the invention. In the specification and the drawings, elements having functions similar to those described in relation to a previous drawing are denoted by the same reference numerals and signs, and a redundant description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

First Embodiment

Figure 1:
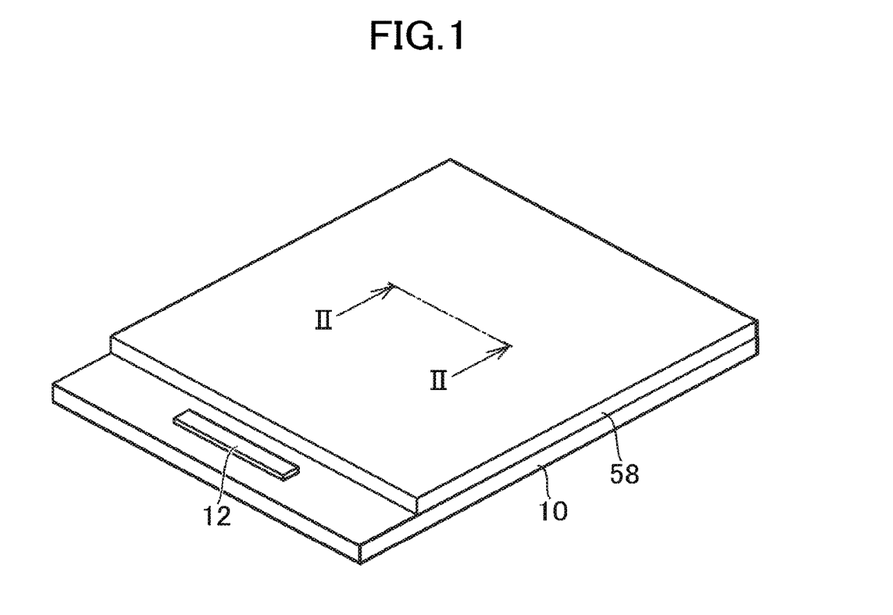
FIG. 1 is a perspective view of a display device according to a first embodiment of the invention.

FIG. 1 is a perspective view of a display device according to a first embodiment of the invention. As the display device, an organic electro-luminescent display device is exemplified. The display device is configured such that, for example, unit pixels (sub-pixels) of multiple colors of red, green, and blue are combined to form a full-color pixel (pixel), thereby displaying a full-color image. The display device includes a substrate 10 made of, for example, glass. An integrated circuit chip 12 for driving elements for displaying an image is mounted on the substrate 10, and a flexible printed board (not shown) for electrical connection to the outside may be connected to the substrate 10.

Figure 2:
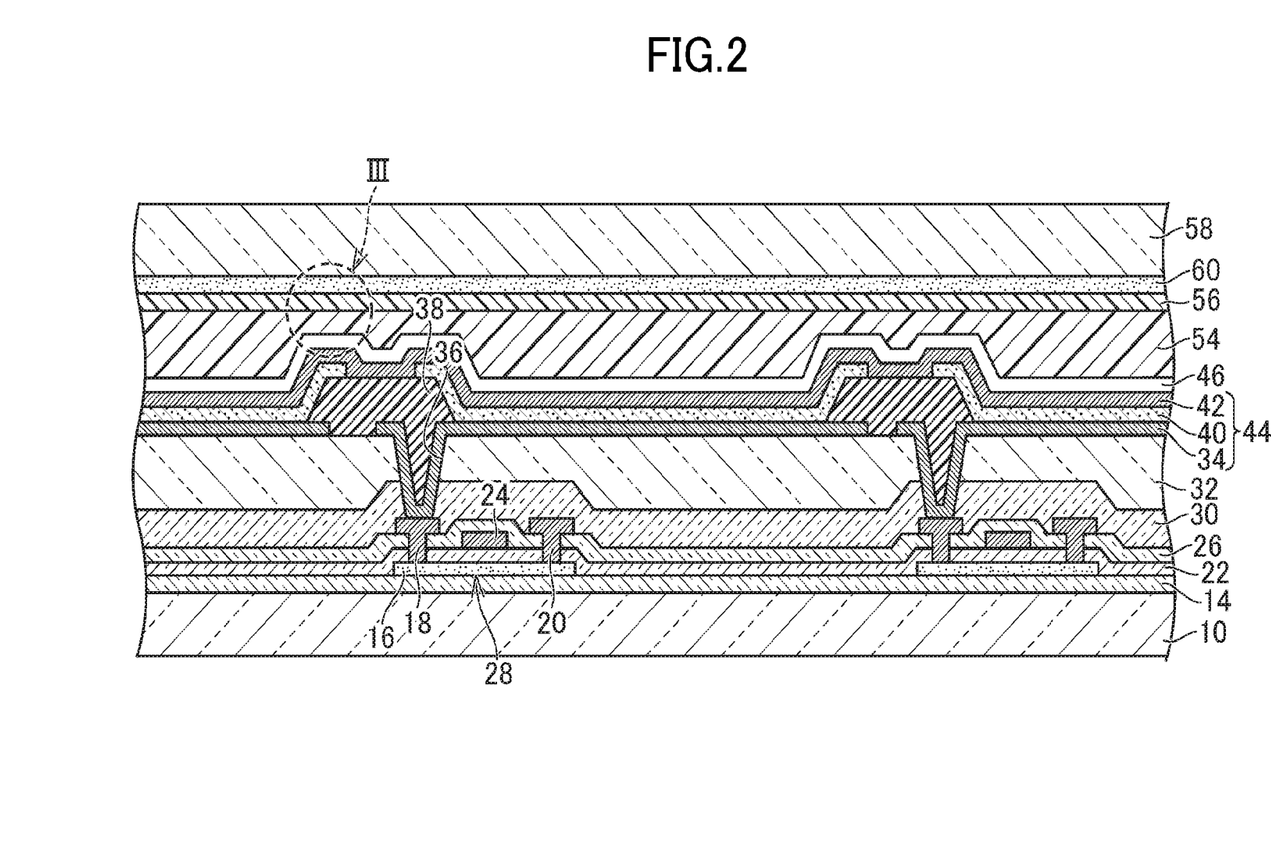
FIG. 2 is an enlarged view of a cross-section of the display device shown in FIG. 1, taken along the line II-II.

FIG. 2 is an enlarged view of a cross-section of the display device shown in FIG. 1, taken along the line II-II. An undercoat 14 serving as a barrier to an impurity contained in the substrate itself is formed on the substrate 10, and a semiconductor layer 16 is formed on the undercoat 14. A source electrode 18 and a drain electrode 20 are electrically connected to the semiconductor layer 16, and a gate insulating film 22 is formed to cover the semiconductor layer 16. A gate electrode 24 is formed on the gate insulating film 22, and an inter-layer insulating film 26 is formed to cover the gate electrode 24. The source electrode 18 and the drain electrode 20 penetrate the gate insulating film 22 and the inter-layer insulating film 26. The semiconductor layer 16, the source electrode 18, the drain electrode 20, and the gate electrode 24 constitute a thin film transistor 28. A passivation film 30 is provided so as to cover the thin film transistor 28.

A planarization layer 32 is provided on the passivation film 30. A plurality of pixel electrodes 34 (e.g., anodes) configured so as to correspond respectively to a plurality of unit pixels are provided on the planarization layer 32. The planarization layer 32 is formed such that at least the surface on which the pixel electrode 34 is provided is flat. The pixel electrode 34 is electrically connected to one of the source electrode 18 and the drain electrode 20 on the semiconductor layer 16 through a contact hole 36 penetrating the planarization layer 32 and the passivation film 30.

An insulating layer 38 is formed on the planarization layer 32 and the pixel electrode 34. The insulating layer 38 is formed so as to lie on the peripheral edge of the pixel electrode 34 and open a portion (e.g., a central portion) of the pixel electrode 34. The insulating layer 38 forms a bank surrounding a portion of the pixel electrode 34.

A light-emitting layer 40 is provided on the pixel electrode 34. The light-emitting layer 40 is provided individually (separately) for each of the pixel electrodes 34, and also lies on the insulating layer 38. In this case, the light-emitting layers 40 emit blue, red, and green light corresponding to the respective pixels. As a modified example, the light-emitting layer 40 may be provided so as to continuously lie on the plurality of pixel electrodes 34 to emit white light, in which case a color filter is provided.

A common electrode 42 (e.g., a cathode) is provided on the light-emitting layer 40. The common electrode 42 is formed so as to lie above the insulating layer 38 serving as a bank. The light-emitting layer 40, and the pixel electrode 34 (anode) and the common electrode 42 (cathode) interposing the light-emitting layer 40 therebetween constitute a light-emitting element 44. The light-emitting layer 40 is interposed between the pixel electrode 34 and the common electrode 42, and emits light with a luminance controlled by an electric current flowing therebetween. At least one layer of a hole transport layer and a hole injection layer (both not shown) may be provided between the light-emitting layer and the pixel electrode 34 (anode). At least one layer of an electron transport layer and an electron injection layer (both not shown) may be provided between the light-emitting layer 40 and the common electrode 42 (cathode).

Figure 3:
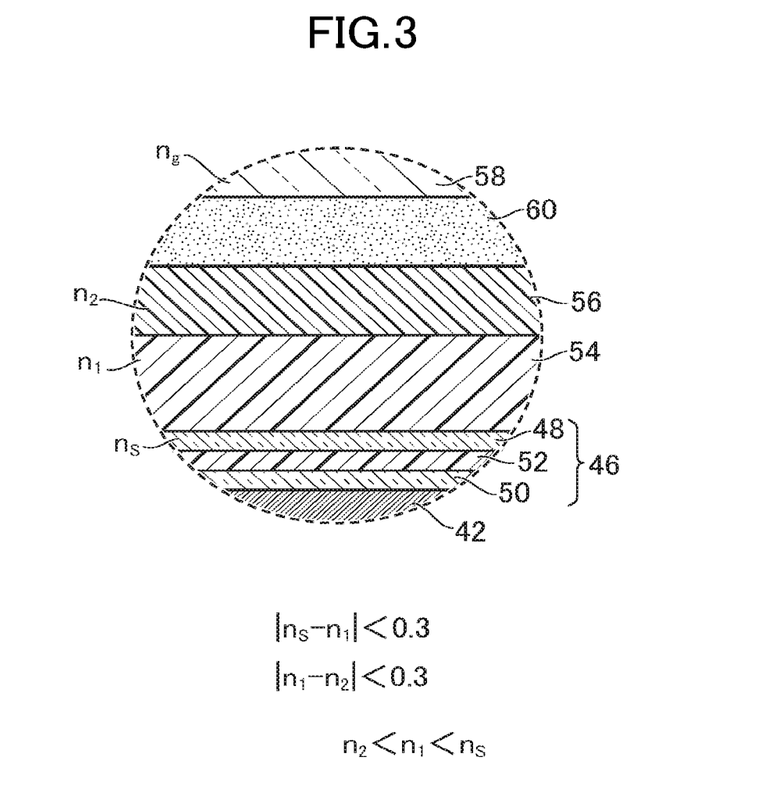
FIG. 3 is an enlarged view of the portion III surrounded by the alternate long and short dashed line in FIG. 2.

FIG. 3 is an enlarged view of the portion III surrounded by the alternate long and short dashed line in FIG. 2. The light-emitting element 44 is covered and thus sealed by a sealing layer 46 stacked on the common electrode 42, so that the light-emitting element 44 is shielded from moisture. At least the uppermost layer of the sealing layer 46 is composed of a silicon nitride film 48. The sealing layer 46 shown in FIG. 3 is composed of three layers, including further a silicon nitride film 50 of the lowermost layer and a resin layer 52 of the intermediate layer. The resin layer 52 of the intermediate layer fills pinholes in the silicon nitride film 50 of the lowermost layer and covers a foreign substance, and thus serves as a flat base on which the silicon nitride film 48 of the uppermost layer lies.

A first resin layer 54 is stacked on the sealing layer 46. The first resin layer 54 is made of an adhesive material and in contact with (adheres to) the silicon nitride film 48. A refractive index $n_s$ of the silicon nitride film 48 is approximately from 1.8 to 2.0, and a refractive index $n_1$ of the first resin layer 54 is approximately from 1.55 to 1.7. The materials and deposition conditions of the silicon nitride film 48 and the first resin layer 54 are set such that the difference between the refractive indices $n_s$ and $n_1$ is less than 0.3. With the settings, since the refractive indices $n_s$ and $n_1$ of the silicon nitride film 48 and the first resin layer 54 are substantially the same as each other, interface reflection can be reduced.

A second resin layer 56 is stacked on the first resin layer 54. The second resin layer 56 is an optical film such as a circular polarizer, and in contact with (adheres to) the first resin layer 54 as an adhesive material. A refractive index $n_2$ of the second resin layer 56 is approximately from 1.45 to 1.6. The materials and deposition conditions of the first resin layer 54 and the second resin layer 56 are set such that the difference between the refractive indices $n_1$ and $n_2$ is less than 0.3. With the settings, since the refractive indices $n_1$ and $n_2$ of the first resin layer 54 and the second resin layer 56 are substantially the same as each other, interface reflection can be reduced.

A glass substrate 58 is disposed above the second resin layer 56. The glass substrate 58 adheres to the second resin layer 56 by means of an adhesive layer 60. The glass substrate 58 may be a cover glass, or may constitute a touch screen with electrodes and wiring (both not shown) formed thereon. A refractive index $n_g$ of the glass substrate 58 is approximately 1.5. The difference between the refractive indices $n_2$ and $n_g$ of the second resin layer 56 and the glass substrate 58 is less than 0.3.

As a modified example, interface reflection can be reduced also by setting the materials and deposition conditions of the silicon nitride film 48, the first resin layer 54, and the second resin layer 56 such that the refractive index $n_1$ of the first resin layer 54 is smaller than the refractive index $n_s$ of the silicon nitride film 48, and that the refractive index $n_2$ of the second resin layer 56 is smaller than the refractive index $n_1$ of the first resin layer 54. This condition may be applied alone separately from the conditions described above, or may be applied in addition to the conditions described above.

Second Embodiment

Figure 4:
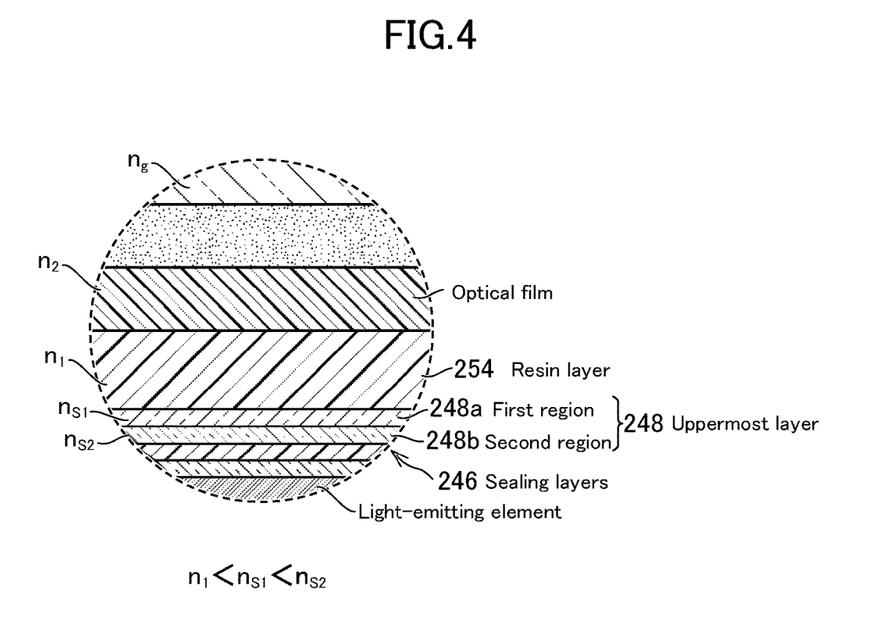
FIG. 4 is a diagram showing a sealing layer of a display device according to a second embodiment.

FIG. 4 is a diagram showing a sealing layer of a display device according to a second embodiment. Also in the embodiment, the sealing layer 246 includes a silicon nitride film 248 of the uppermost layer, and a refractive index of a first resin layer 254 is smaller than a refractive index of the silicon nitride film 248.

In the silicon nitride film 248 of the uppermost layer, a refractive index $n_{s2}$ of an inner layer 248b that is a portion close to the light-emitting element 44 (see FIG. 2) is larger than a refractive index $n_{s1}$ of a surface layer 248a that is a portion close to the first resin layer 254, and the refractive index changes stepwise or continuously from the surface side toward the inner side. In the example shown in FIG. 4, the refractive index changes in two steps with two layers of the surface layer 248a and the inner layer 248b. The refractive index $n_{s1}$ of the surface layer 248a is approximately from 1.65 to 1.8, and the refractive index $n_{s2}$ of the inner layer 248b is approximately from 1.8 to 2.0. When the surface layer 248a and the inner layer 248b are formed by plasma chemical vapor deposition (CVD), the material flow ratio, pressure, output, and the like are adjusted such that the proportion of silicon of the surface layer 248a is low compared with that of the inner layer 248b.

According to the embodiment, since the refractive index of the silicon nitride film 248 of the uppermost layer of the sealing layer 246 decreases stepwise or continuously toward the first resin layer 254, the difference between the refractive indices of the silicon nitride film 248 and the first resin layer 254 is reduced, and thus interface reflection can be reduced. The details described in the first embodiment apply to other details of the second embodiment.

Third Embodiment

Figure 5:
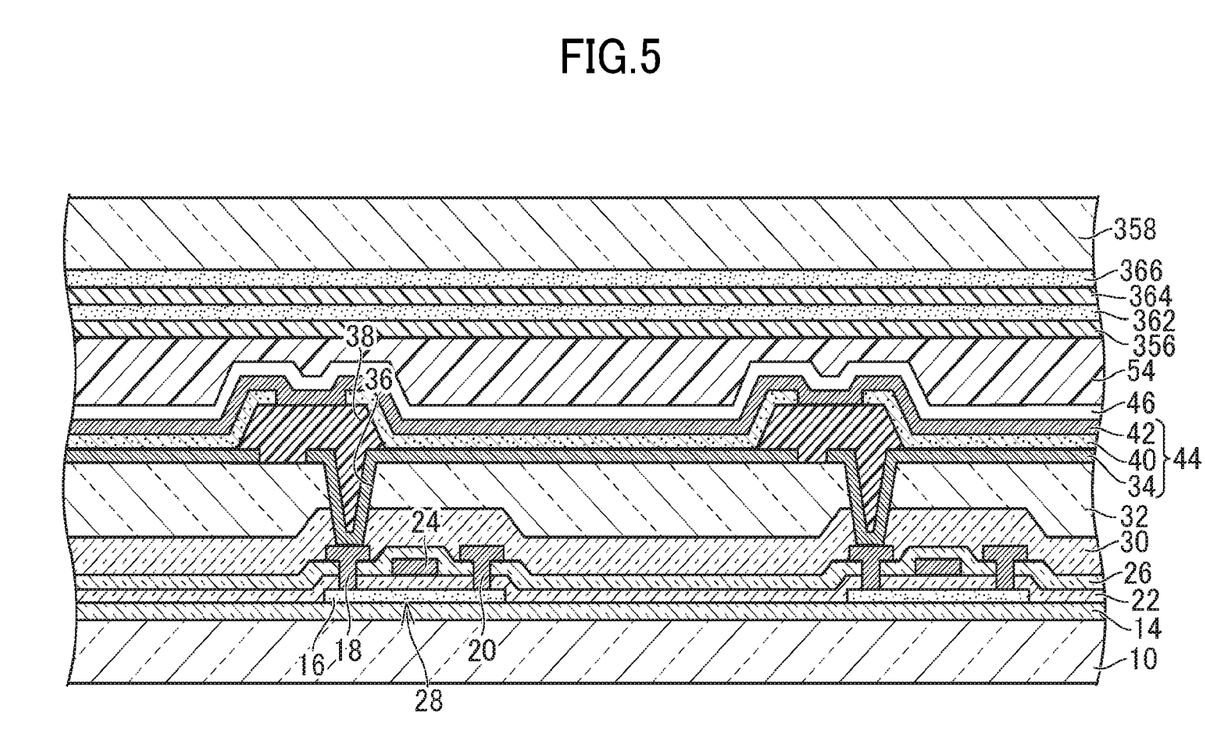
FIG. 5 is a cross-sectional view of a display device according to a third embodiment.

FIG. 5 is a cross-sectional view of a display device according to a third embodiment. In the embodiment, a second resin layer 356 is a light-transmissive film provided for reinforcement or protection. The second resin layer 356 transmits a light beam, but at least a polarizer is excluded. A circular polarizer 364 is disposed on the second resin layer 356 through an adhesive material 362. A glass substrate 358 is attached on the circular polarizer 364 through an adhesive material 366. The details described in the first embodiment apply to other details of the third embodiment.

Fourth Embodiment

Figure 6:
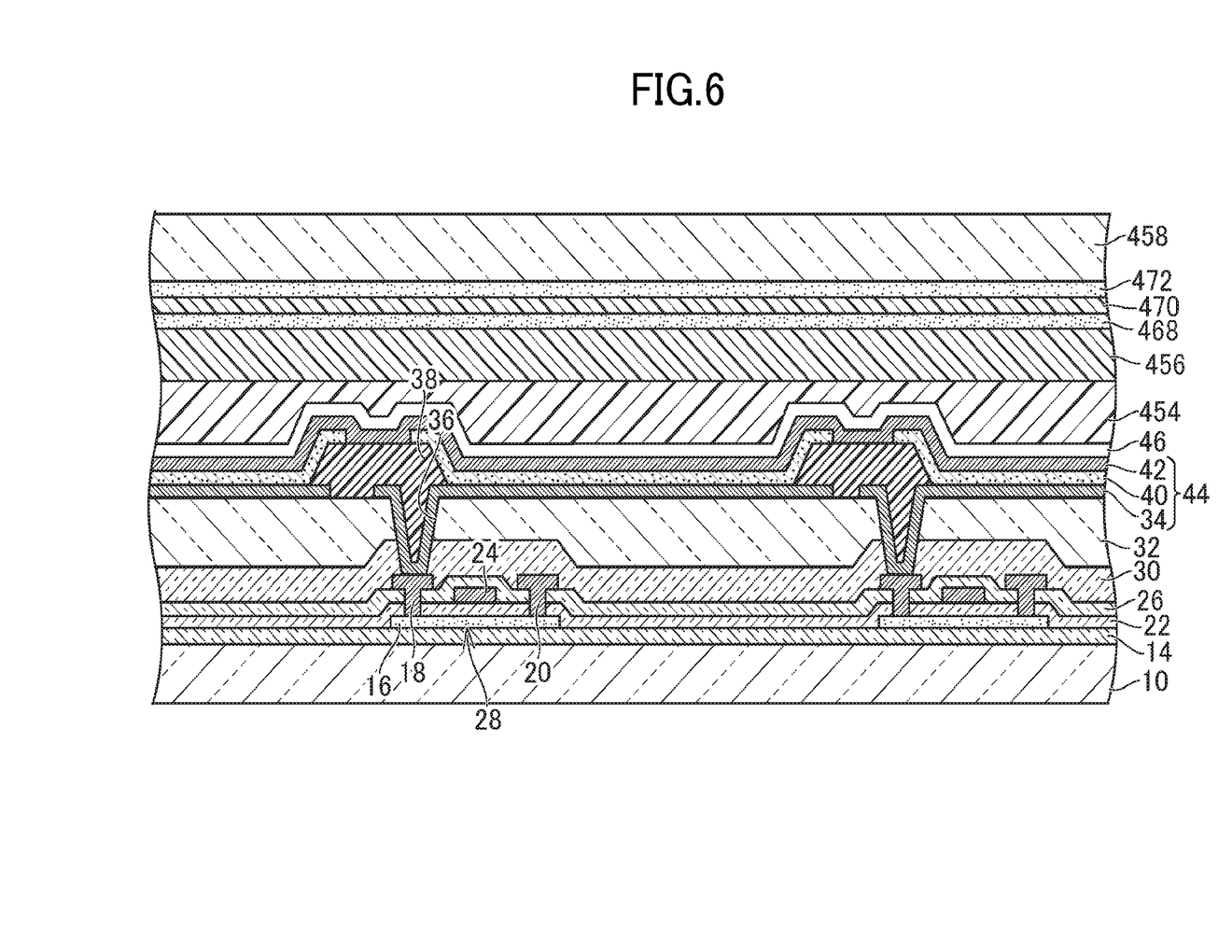
FIG. 6 is a cross-sectional view of a display device according to a fourth embodiment.

FIG. 6 is a cross-sectional view of a display device according to a fourth embodiment. In the embodiment, a first resin layer 454 is made of a bonding material and is in a cured state. A second resin layer 456 is a light transmissive substrate provided for reinforcement or protection. The second resin layer 456 transmits a light beam, but at least a polarizer is excluded. An optical film 470 such as a circular polarizer is disposed on the second resin layer 456 through an adhesive material 468. A glass substrate 458 is attached on the optical film 470 through an adhesive material 472. The details described in the first embodiment apply to other details of the fourth embodiment.

The display device is not limited to an organic electroluminescent display device, but may be a display device including a light-emitting element such as a quantum-dot light-emitting element (quantum-dot light-emitting diode (QLED)) in each pixel or a liquid crystal display device.

The invention is not limited to the embodiments described above but can be variously modified. For example, the configuration described in each of the embodiments may be replaced with substantially the same configuration, a configuration providing the same operational effect, or a configuration capable of achieving the same object.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a light-emitting element including a light-emitting layer, an anode, and a cathode, the anode and the cathode interposing the light-emitting layer therebetween;
    sealing layers covering the light-emitting element, at least an uppermost layer of the sealing layers being composed of a silicon nitride film;
    a first resin layer stacked on and in contact with the silicon nitride film; and
    a second resin layer stacked on and in contact with the first resin layer, wherein
    a difference between refractive indices of the silicon nitride film and the first resin layer is less than 0.3, and
    a difference between refractive indices of the first resin layer and the second resin layer is less than 0.3.

2. The display device according to claim 1, wherein the first resin layer is made of an adhesive material or a bonding material.

3. The display device according to claim 1, wherein the second resin layer is an optical film.

4. The display device according to claim 1, wherein the second resin layer is a light-transmissive film or substrate.

5. The display device according to claim 4, wherein an optical film is disposed on the second resin layer.

6. The display device according to claim 1, wherein a glass substrate is disposed above the second resin layer.

7. A display device comprising:
    a light-emitting element including a light-emitting layer, an anode, and a cathode, the anode and the cathode interposing the light-emitting layer therebetween;
    sealing layers covering the light-emitting element, at least an uppermost layer of the sealing layers being composed of a silicon nitride film;
    a first resin layer stacked on and in contact with the silicon nitride film; and
    a second resin layer stacked on and in contact with the first resin layer, wherein
    a refractive index of the first resin layer is smaller than a refractive index of the silicon nitride film, and
    a refractive index of the second resin layer is smaller than the refractive index of the first resin layer.

8. The display device according to claim 7, wherein the first resin layer is made of an adhesive material or a bonding material.

9. The display device according to claim 7, wherein the second resin layer is an optical film.

10. The display device according to claim 7, wherein the second resin layer is a light-transmissive film or substrate.

11. The display device according to claim 10, wherein an optical film is disposed on the second resin layer.

12. The display device according to claim 7, wherein a glass substrate is disposed above the second resin layer.

13. A display device comprising:
    a light-emitting element including a light-emitting layer, an anode, and a cathode, the anode and the cathode interposing the light-emitting layer therebetween;

sealing layers covering the light-emitting element, at least an uppermost layer of the sealing layers being composed of a silicon nitride film;

a resin layer stacked on and in contact with the silicon nitride film, the resin layer being made of a bonding material or an adhesive material; and an optical film stacked on an opposite side of the resin layer from the silicon nitride film, the optical film being in contact with the resin layer, wherein the silicon nitride film includes a first region in contact with the resin layer, and a second region which is closer to the light-emitting element than the first region is, the first region has a first refractive index, the second region has a second refractive index, and a difference between a refractive index of the resin layer and the first refractive index is smaller than a difference between the refractive index of the resin layer and the second refractive index.

14. The display device according to claim 13, wherein a refractive index of the silicon nitride film changes stepwise.

15. The display device according to claim 13, wherein differences among the first refractive index, the refractive index of the resin layer, and a refractive index of the optical film are less than 0.3.

16. The display device according to claim 13, wherein the refractive index of the resin layer is smaller than the first refractive index, and a refractive index of the optical film is smaller than the refractive index of the resin layer.

17. The display device according to claim 13, wherein the optical film includes a circular polarizer.

18. The display device according to claim 13, wherein a glass substrate is disposed on an opposite side of the optical film from the resin layer, and a difference between a refractive index of the glass substrate and a refractive index of the optical film is less than 0.3.

19. The display device according to claim 18, wherein the glass substrate is a touch screen.

* * * * *